United States Patent
Inaba

(10) Patent No.: US 9,773,838 B2
(45) Date of Patent: Sep. 26, 2017

(54) MAGNETORESISTIVE MEMORY DEVICE AND MANUFACTURING METHOD OF THE SAME

(71) Applicant: TOSHIBA MEMORY CORPORATION, Minato-ku, Tokyo (JP)

(72) Inventor: Satoshi Inaba, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 46 days.

(21) Appl. No.: 14/643,657

(22) Filed: Mar. 10, 2015

(65) Prior Publication Data
US 2016/0071907 A1 Mar. 10, 2016

Related U.S. Application Data

(60) Provisional application No. 62/046,039, filed on Sep. 4, 2014.

(51) Int. Cl.
| | |
|---|---|
| *H01L 27/10* | (2006.01) |
| *H01L 27/22* | (2006.01) |
| *H01L 29/78* | (2006.01) |
| *H01L 43/12* | (2006.01) |
| *H01L 29/66* | (2006.01) |

(52) U.S. Cl.
CPC ........ *H01L 27/228* (2013.01); *H01L 29/6681* (2013.01); *H01L 29/785* (2013.01); *H01L 43/12* (2013.01)

(58) Field of Classification Search
CPC . H01L 27/228; H01L 29/6681; H01L 29/785; H01L 43/12; H01L 27/222; H01L 23/528; H01L 27/226; H01L 43/08; H01L 43/10; H01L 43/02; G11C 11/1659; G11C 11/1675; G11C 11/161
See application file for complete search history.

(56) References Cited

U.S. PATENT DOCUMENTS

| 8,581,337 B2 | 11/2013 | Kye et al. |
| 8,711,602 B2 | 4/2014 | Watanabe et al. |
| 2007/0026615 A1* | 2/2007 | Goktepeli ............. H01L 29/785 438/281 |

(Continued)

FOREIGN PATENT DOCUMENTS

| JP | 2012235063 A | 11/2012 |
| JP | 2013055134 A | 3/2013 |

*Primary Examiner* — William F Kraig
*Assistant Examiner* — Pavel Ivanov
(74) *Attorney, Agent, or Firm* — Holtz, Holtz & Volek PC

(57) ABSTRACT

According to one embodiment, there is provided a magnetoresistive memory device. The memory device includes active areas arranged on a semiconductor substrate, resistance change elements arrayed to matrix in an X direction and a Y direction above the substrate, and selective transistors provided to correspond to the respective resistance change elements. A plurality of gate electrodes of the selective transistors are spaced apart at regular intervals in the X direction and arranged along the Y direction. Each of the active areas is provided to cross two of the gate electrodes adjacent to each other, such as to be along the X direction at a portion crossing the gate electrodes, and formed to be inclined with respect to the X direction between the adjacent gate electrodes.

11 Claims, 20 Drawing Sheets

(56) References Cited

U.S. PATENT DOCUMENTS

2012/0286339 A1* 11/2012 Asao ................. H01L 27/228
  257/295
2013/0329489 A1* 12/2013 Kim ................... G11C 11/1675
  365/158

* cited by examiner

Prior Art

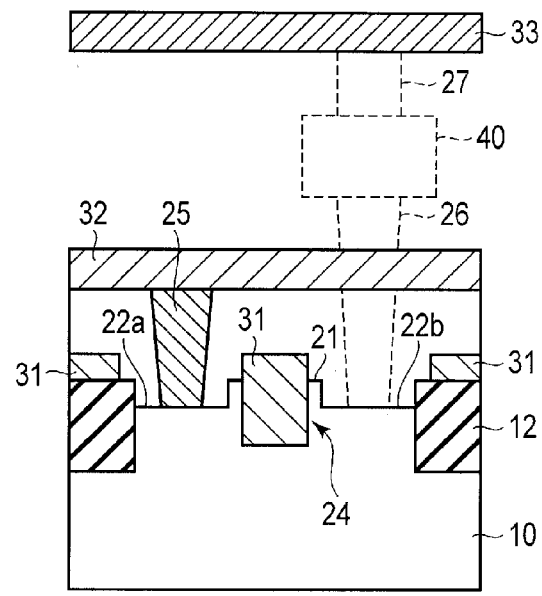
F I G. 5A
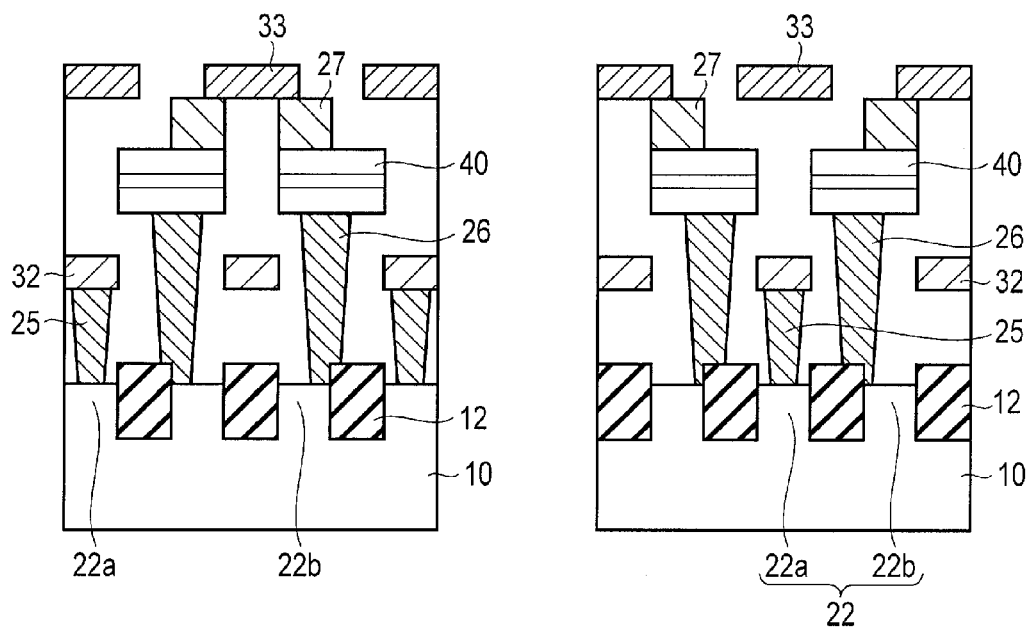
F I G. 5B        F I G. 5C

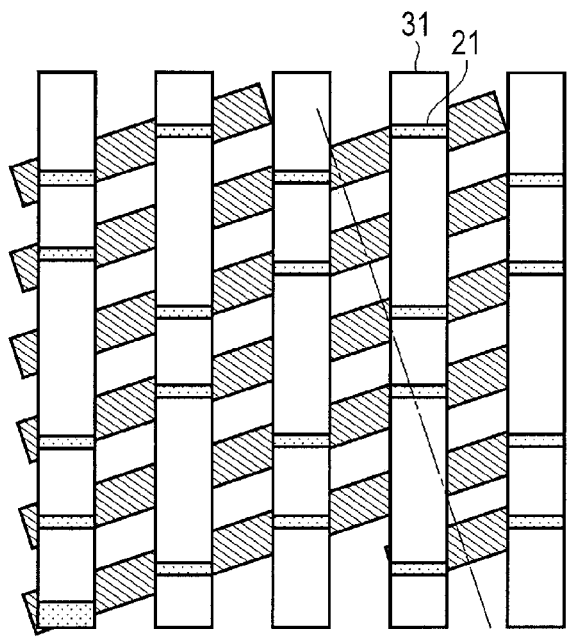
F I G. 6I
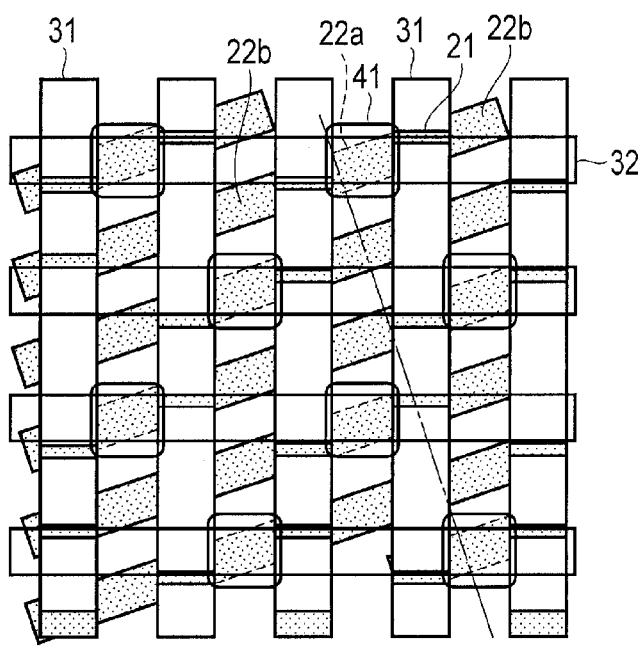
F I G. 6J

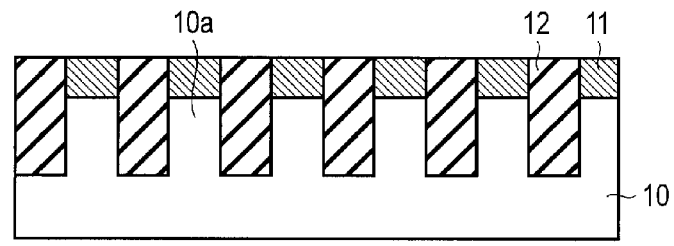
F I G. 7A
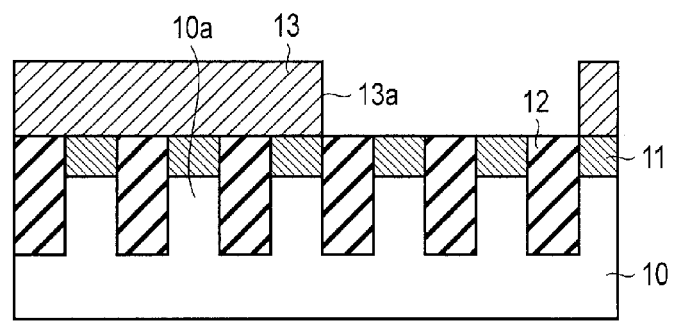
F I G. 7B
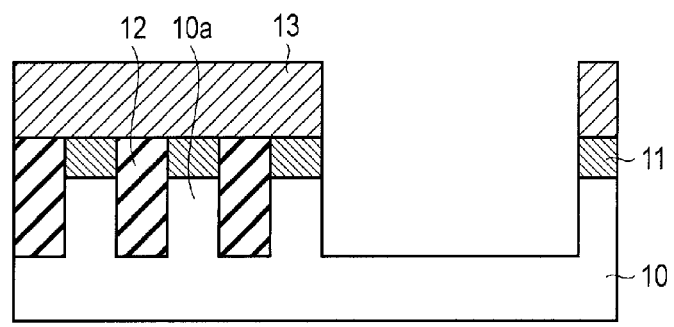
F I G. 7C
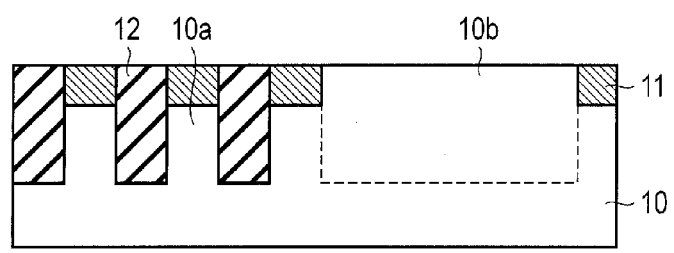
F I G. 7D

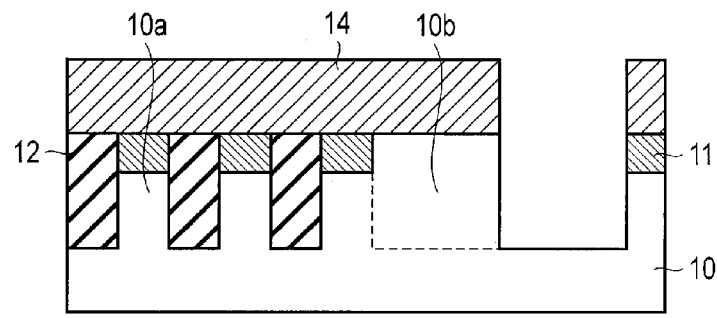
F I G. 7E
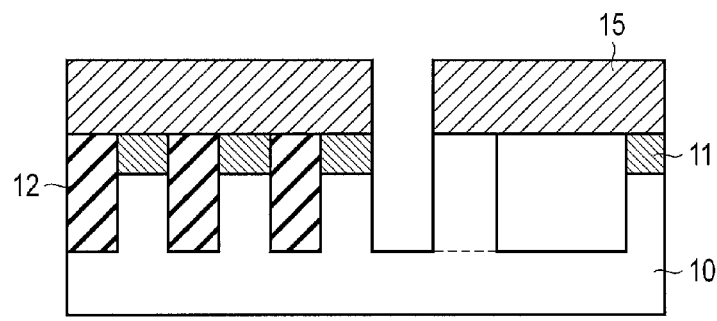
F I G. 7F
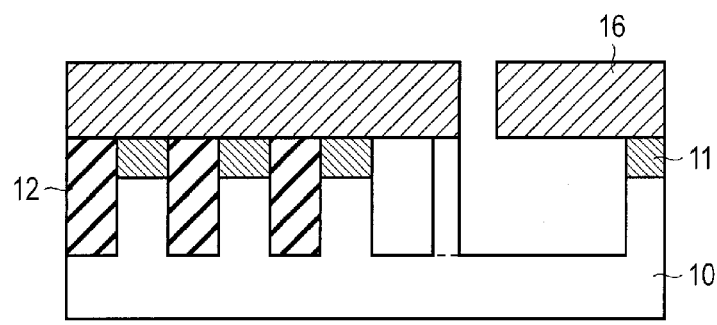
F I G. 7G
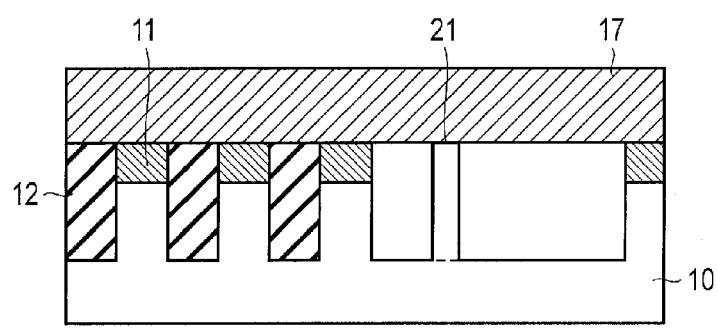
F I G. 7H

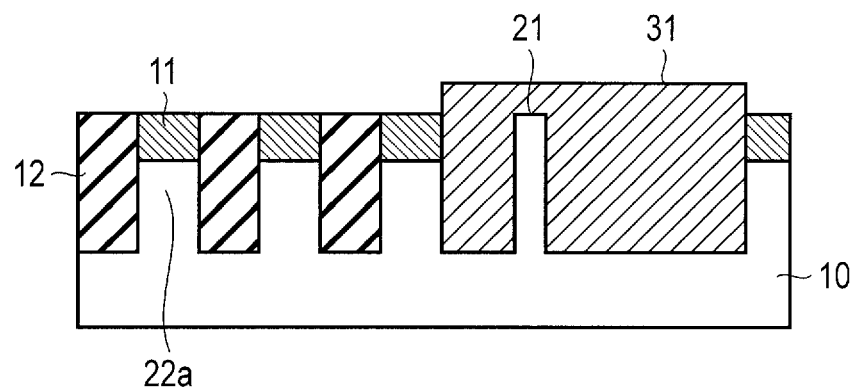
F I G. 7I
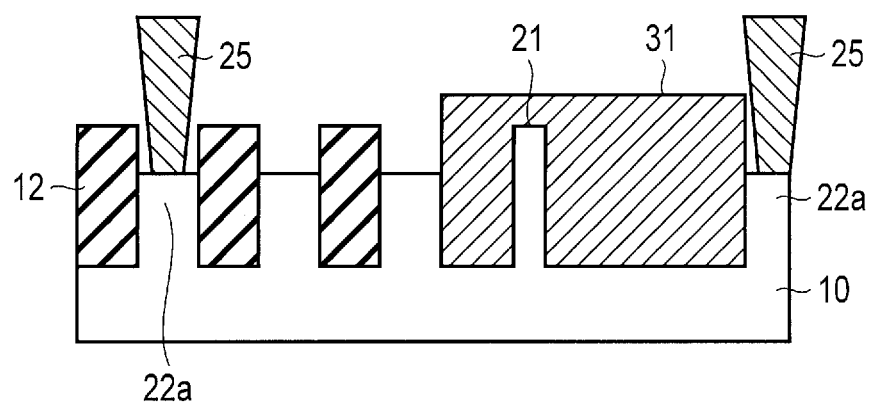
F I G. 7J

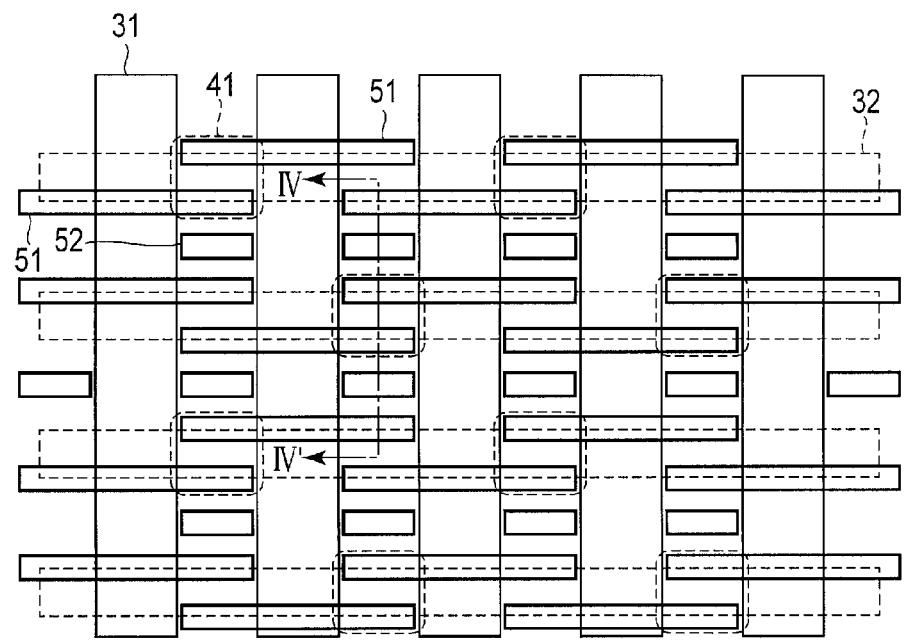
F I G. 10E
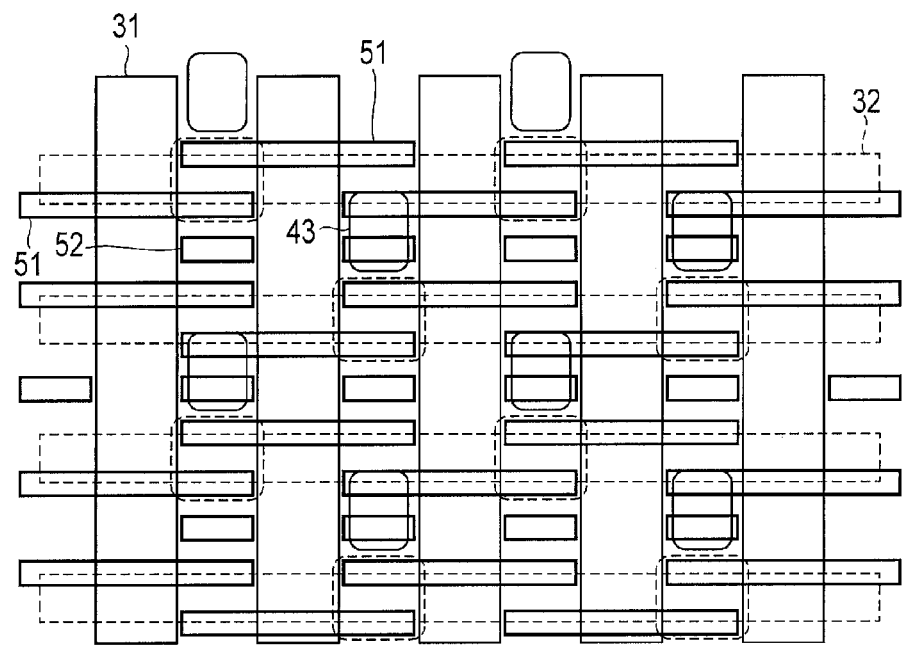
F I G. 10F

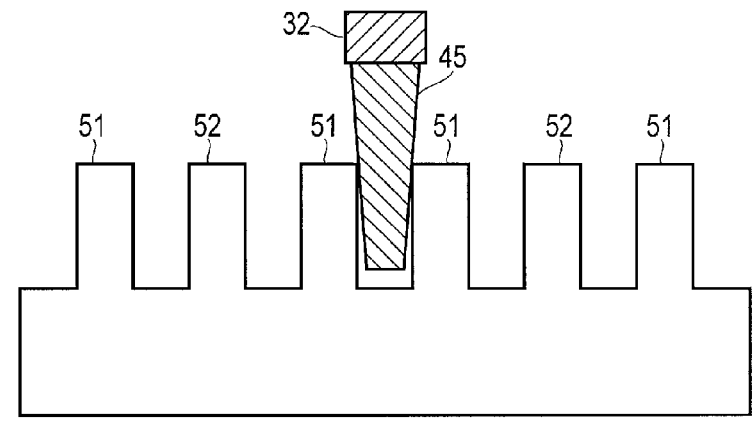
F I G. 11A
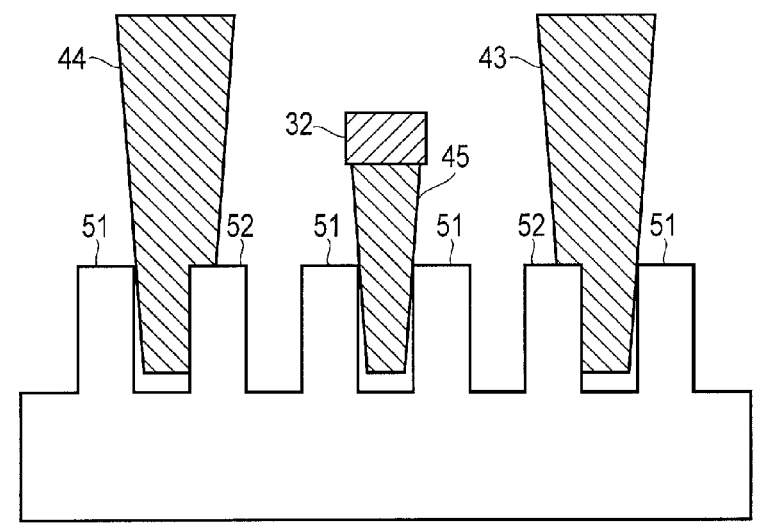
F I G. 11B
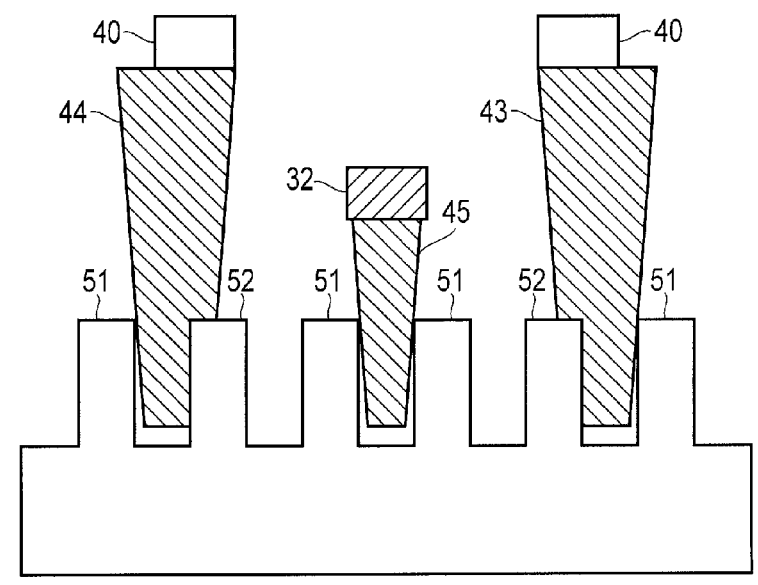
F I G. 11C

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/046,039, filed Sep. 4, 2014, the entire contents of which are incorporated herein by reference.

FIELD

Embodiments described herein relate generally to a magnetoresistive memory device and a manufacturing method of the same.

BACKGROUND

A simplest example of MRAM that is a typical resistance change type memory has a structure called 1T/1R. The greatest problem in this memory structure is how a large amount of current is flowed from a transistor to a resistance change element in a determined cell area.

If a cell transistor size is miniaturized in accordance with a finer area of the cell, various difficulties should occur. One of the difficulties is that a device performance is deteriorated (i.e., an off-leakage current is increased) due to a short channel effect based on a shorter gate length. Another difficulty is that if a cell area is to be reduced, contact regions for source and drain electrodes also become smaller. Therefore, the increase in a parasitic resistance (contact resistance) at this part gives a serious influence to deterioration of a current drive.

In future, suppression of the short channel effect and enhancement of performance of the current drive need to be attempted by forming so called a multi-gate device. In this case, a device layout in which a transistor can be easily arranged should be required.

BRIEF DESCRIPTION OF THE DRAWINGS

FIGS. 5A to 5C are views showing a cross-section seen along arrow direction I-I', a cross-section seen along arrow direction II-II' and a cross-section seen along arrow direction III-III' in FIG. 4, respectively.

FIGS. 6A to 6J are plan views showing steps of manufacturing the MRAM according to the first embodiment, respectively.

FIGS. 7A to 7J are plan views showing steps of manufacturing the MRAM according to the first embodiment, respectively.

FIGS. 10A to 10H are plan views showing steps of manufacturing the MRAM according to the second embodiment, respectively.

FIGS. 11A, 11B, and 11C are cross-sectional views seen along one-dot-chained lines shown in FIGS. 10E, 10G, and 10H, respectively.

DETAILED DESCRIPTION

In general, according to one embodiment, there is provided a magnetoresistive memory device. The memory device comprises active areas arranged and spaced apart at regular intervals, on a semiconductor substrate, resistance change elements arrayed in a matrix, in an X direction and a Y direction perpendicular to the X direction, above the substrate, and selective transistors provided to correspond to the respective resistance change elements, in the active areas. A plurality of gate electrodes of the selective transistors are spaced apart at regular intervals in the X direction and arranged along the Y direction. Each of the active areas is provided to cross two of the gate electrodes adjacent to each other, such as to be along the X direction at a portion of each of the active areas crossing the gate electrodes, and formed to be inclined with respect to the X direction between the adjacent gate electrodes.

Embodiments will be hereinafter described with reference to the accompanying drawings.

As described above, a device structure in which a parasitic resistance at a selective transistor portion is small enough to flow a sufficient bidirectional current and the property variation is small needs to be implemented in a resistance change memory such as an MRAM.

(Referential Example)

First, an example of a cell layout of an MRAM using a resistance change element, based on a $6F^2$-type cell layout proposed for DRAM is described (JP-A 2012-235063 (KOUKAI)).

Figure 1:
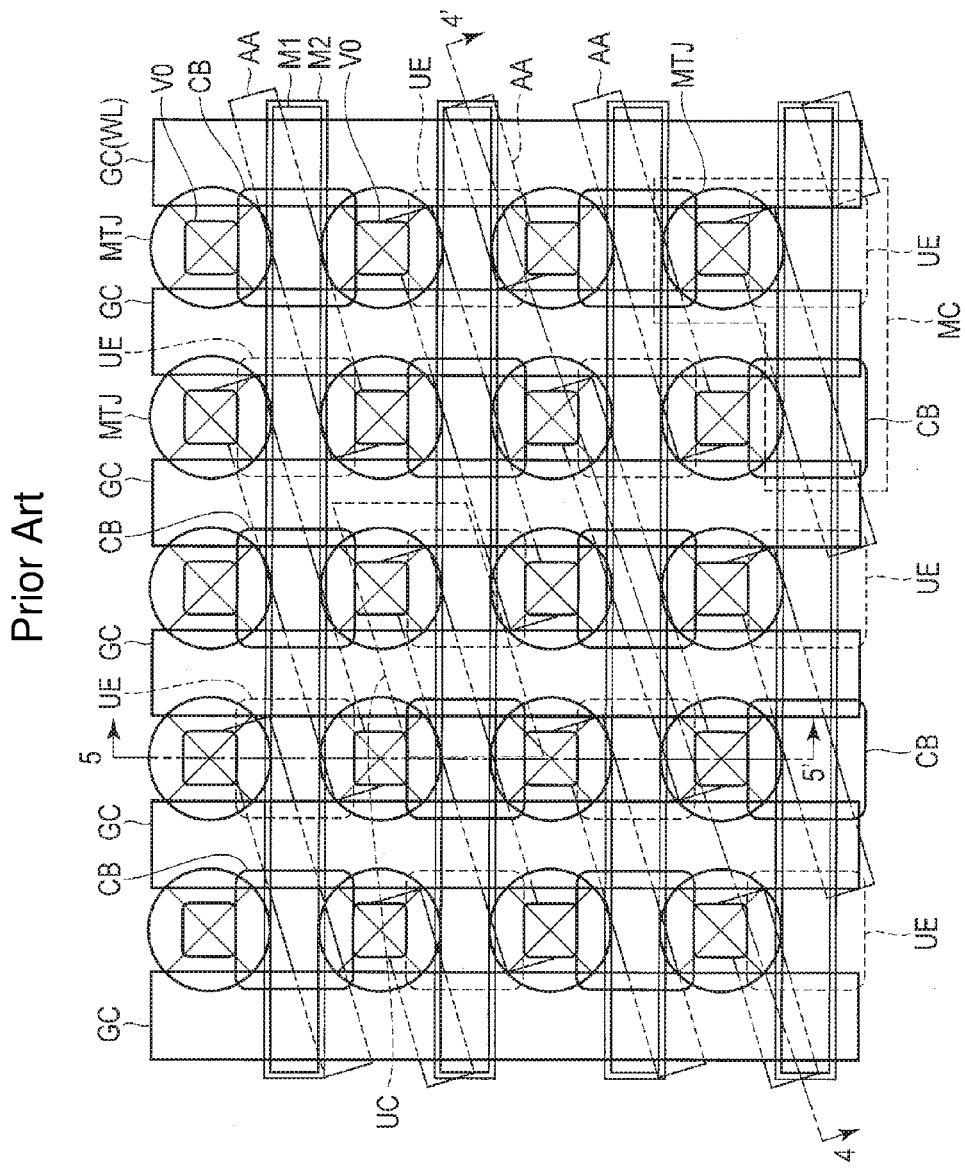
FIG. 1 is a view showing a planar layout of an MRAM cell according to a referential example.
Figure 2A:
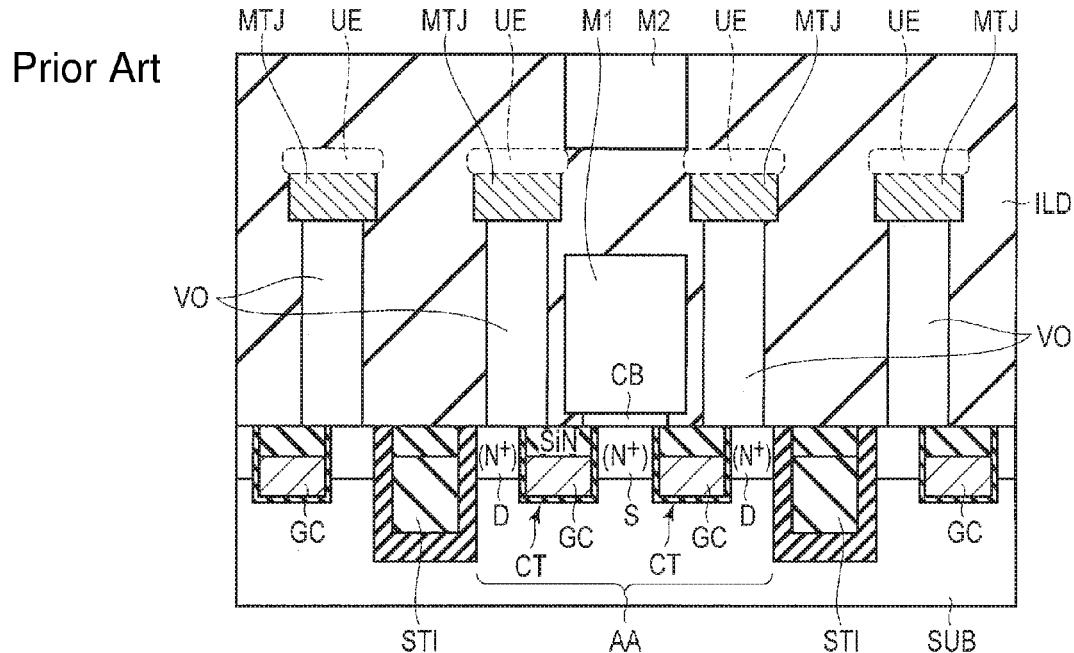
FIGS. 2A and 2B are views showing a cross-section seen along arrow direction 4-4' and a cross-section seen along arrow direction 5-5' in FIG. 1, respectively.
Figure 2B:
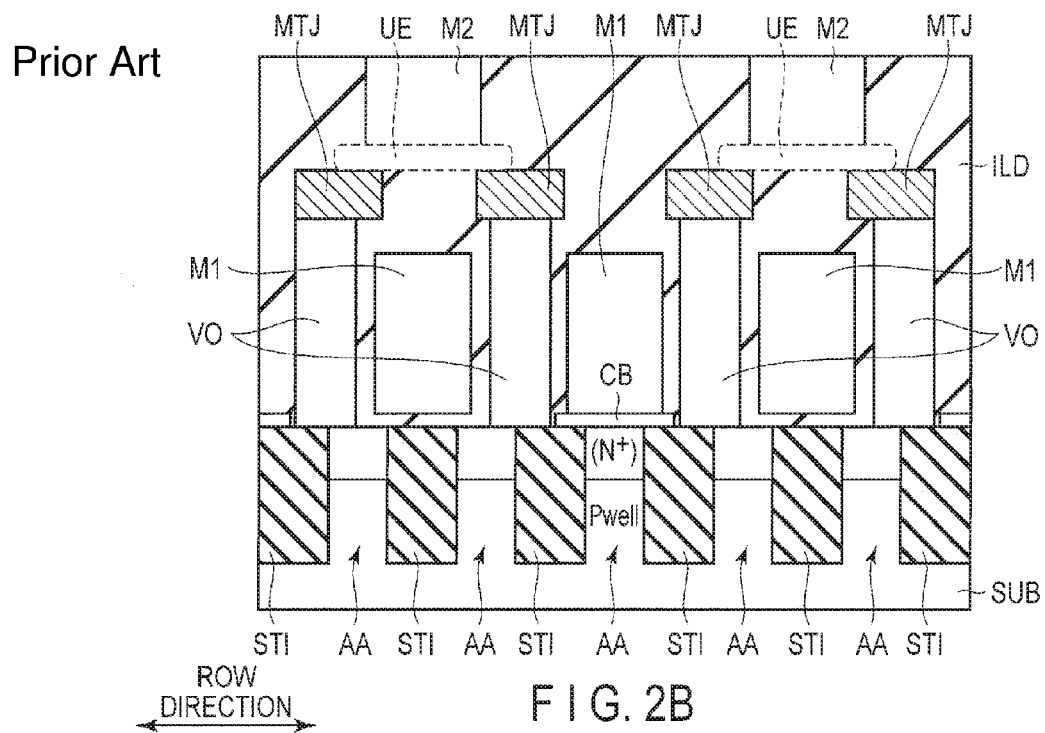

FIG. 1 is a view showing a planar layout of the MRAM cell according to the referential example. FIG. 2A is a cross-sectional view seen along arrow direction 4-4' in FIG. 1. FIG. 2B is a cross-sectional view seen along arrow direction 5-5' in FIG. 1. In the drawings, SUB presents a silicon substrate, AA presents an active area, GC (WL) presents a gate electrode (word line), M1 presents a source line, M2 presents a bit line, and MTJ presents a magnetoresistive effect element which is one of resistance change elements. Furthermore, CB presents a source contact, UE presents a contact for MTJ, CT presents a cell transistor, S presents a source, D presents a drain, VO presents a drain contact, STI presents a device isolation insulating film, and MC presents a unit cell. The most characteristic feature of the referential example is that a silicon region forming AA extends in not vertically or horizontally, but obliquely with a certain angle. This is because where F presents a feature size, a region of 3F forms a cell in a direction vertical with WL long side (i.e., a landscape orientation) and a region of 2F forms a cell in a direction parallel with the WL long side (i.e., a portrait orientation). The AA is inclined at about 18 degrees. The reason is that the contact region needs to be shared with a transistor of an adjacent cell on the source side and needs to be connected to another M2 via the resistance change element on the drain side. Furthermore, the layout of obliquely arranging the AA is proposed since the M1 on the source side and the M2 on the drain side need to be arranged alternately. Accordingly, when a transistor is noticed, the WL serving as the gate electrode is considered to obliquely overlap the AA.

Such a structure is rarely considered as a problem in a conventional planar single gate MOSFET, but has a problem in a double-gate device represented by Fin-FET or a multi-gate device represented by a tri-gate, etc.

If a gate electrode, having a physical gate length, is arranged obliquely to the fin, in the Fin-FET, a region where a front gate and a back gate of the Fin-FET do not overlap is generated. At such portion, control of an electrostatic potential in the channel should becomes weak, because of no double-gate operation in such region. For this reason, a leakage current should be great in such case. In addition, in rest of channel region where the front gate and the back gate overlap each other and the double-gate operation is executed, an effective channel length should be short. For this reason, suppression of the short channel effect of the transistor becomes weak, with the same physical gate length.

Accordingly, as in the layout shown in FIG. 2, the channel region and the WL region (gate region) of the transistor need to be definitely perpendicular to each other, and the front gate and the back gate need to overlap to maximum extent. Furthermore, a wafer notch on a general standard wafer is formed in a direction [110]. For this reason, a side surface of the active area inclined at an angle of 18 degrees is not a surface (110) or, naturally, is not a surface (100). Accordingly, an interface state density Dit in the channel region is expected to become large, if the double-gate device uses the side surface of the active area in the original layout in FIG. 1. This matter is not so desirable from the viewpoint of device reliability.

Figure 3:
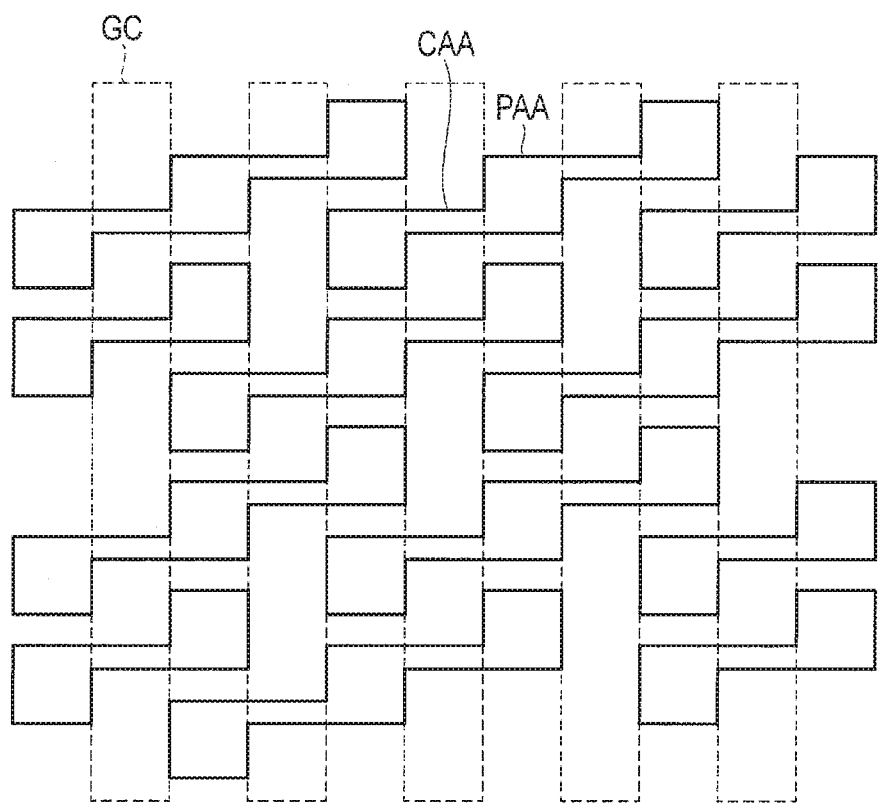
FIG. 3 is a view showing an active area layout which is electrically equivalent to the layout shown in FIG. 1, for setting a direction of the active area to be perpendicular to a word line direction.

FIG. 3 describes a basic idea on how the same layout as that shown in FIG. 1 can be obtained, under precondition that the direction of the active area in the channel region is at least set to be vertical with the direction of the WL long side. All patterns are formed in straight lines of the landscape and portrait orientations in the drawing including the contact pad region where the contact region is formed.

A desired layout is implemented by displacing an active area CAA of the channel portion and an active area PAA of the contact pad portion. In other words, the CAA is vertical with the gate electrode GC forming the word line WL. In this case, a physical layout can be formed. In fact, however, since a distance (width) in the device isolation region between contact pads is short, various manufacturing processes such as lithography, etching, filling of the insulating film in the device isolation region can be easily expected to be difficult.

Such difficulties are solved in the embodiments described below.

(First Embodiment)

Figure 4:
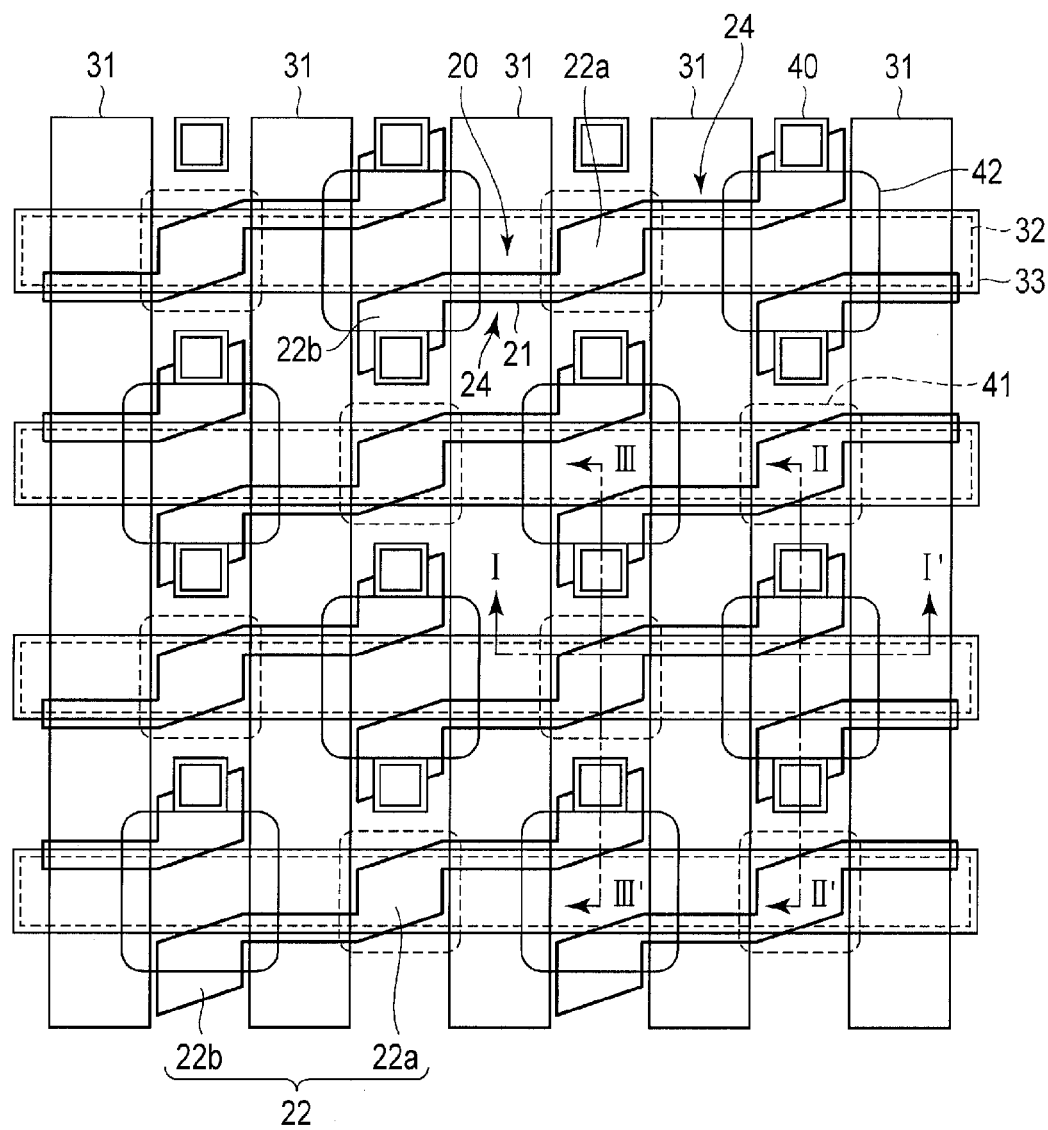
FIG. 4 is a view showing a planar layout of an MRAM cell according to a first embodiment.

FIG. 4 is a plan view showing a layout of MRAM cell according to a first embodiment. FIG. 5A is a cross-sectional view seen along arrow direction I-I' in FIG. 4, FIG. 5B is a cross-sectional view seen along arrow direction II-II' in FIG. 4, and FIG. 5C is a cross-section seen along arrow direction in FIG. 4, respectively.

Active areas 20 are arranged and spaced apart from each other at regular intervals, on a silicon substrate 10. A plurality of gate electrodes (word lines) 31 are arranged along a Y direction and spaced apart from each other at regular intervals in an X direction so as to cross the active areas 20. Each of the active areas 20 is provided to cross two adjacent gate electrodes 31. In addition, each of the active areas 20 is provided in a fin shape along the X direction, at a portion (fin-shaped active area) 21 crossing each gate electrode 31, and is formed to be inclined from the X direction, at a portion (contact) 22 provided between adjacent gate electrodes.

One of parts of the contact portion 22 is a source-side contact region 22a, and the other part is a drain-side contact region 22b. The source-side contact region 22a and the drain-side contact region 22b are shaped in a parallelogram as seen from a substrate surface in the vertical direction. An angle θ made between a direction linking a center of the source-side contact region 22a and a center of the drain-side contact region 22b, and a channel length direction, is an angle (approximately 18 degrees) presented by $\theta=\tan^{-1}(\frac{1}{3})$. This means that a cell region is displaced by 6F in the X direction and by 2F in the Y direction.

A selective transistor 24 for switching comprising the word line 31 crossing the fin-shaped active area 21 is formed in each active area 20. Sources of two adjacent transistors 24 are shared in the source-side contact region 22a. The source-side contact region 22a is connected to each of source lines 32 arranged along the X direction and spaced apart from each other at regular intervals in the Y direction, via a contact plug 25.

MTJ elements 40 are arrayed above the substrate 10, in a matrix in the X direction and the Y direction perpendicular to the X direction. A lower end of each MTJ element 40 is connected to the drain-side contact region 22b via the contact plug 26. An upper end of each MTJ element 40 is connected to each of bit lines 33 arranged along the X direction and spaced apart from each other at regular intervals in the Y direction, similarly to the source line 32, via a contact plug 27. The bit line 33 is formed above the source line 32.

In FIG. 4, a portion 41 surrounded by a broken line indicates a source contact portion, and a portion 42 surrounded by a solid line indicates a drain contact portion.

In the present embodiment, a contact pad region (source-side contact region 22a and drain-side contact region 22b) where the contact is formed is shaped in a parallelogram, which is substantially the same as that shown in FIG. 1. Furthermore, the active area (fin-shaped active area) 21 in the channel region is arranged to be vertical with the WL long side direction. These are the features of the present embodiment.

In the layout of the contact pad region (source-side contact region 22a) shaped in a parallelogram, on the source side, the right channel region is formed near an upper side of the parallelogram and the left channel region is formed near a lower side of the parallelogram. In the layout of the contact pad region (drain-side contact region 22b) shaped in a parallelogram, on the drain side, the left channel region is formed near a lower side of the parallelogram and the right channel region is formed near an upper side of the parallelogram. Thus, the same advantage as that in the case of FIG. 1 where the active area is arranged obliquely can be obtained. Furthermore, since the gate electrode and the channel region are perpendicular to each other, areal overlapping in the region where the front gate and the back gate are facing can be maximized in the double-gate FET. For this reason, sufficient suppression of a short channel effect can be expected.

Next, a manufacturing method of the present embodiment will be described.

FIGS. 6A to 6J and FIGS. 7A to 7J describe steps of manufacturing the MRAM according to the first embodiment. FIG. 6A to FIG. 6J are plan views and FIGS. 7A to 7J are cross-sectional views. FIGS. 7A to 7J show cross sections cut in broken lines in FIGS. 6A to 6J, respectively. In addition, FIG. 6C, and FIGS. 6E to 6I show states in which a mask has been removed after etching, for simple explanation.

Figure 6A:
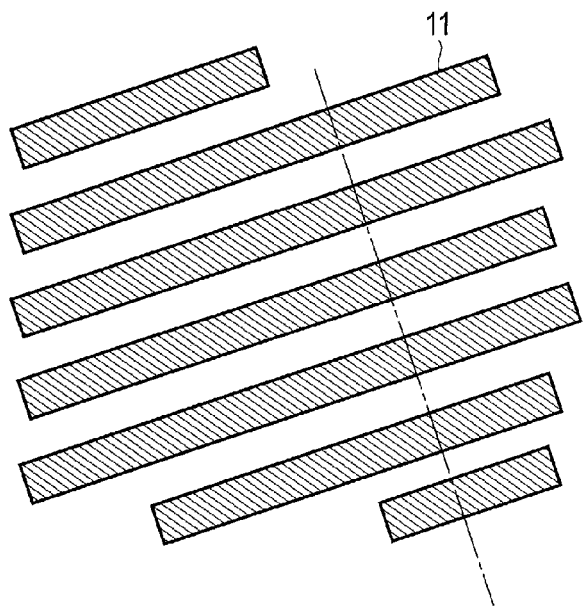

First, as shown in FIG. 6A and FIG. 7A, the active area is patterned in a general manner, similar to the patterning of the layout shown in FIG. 1. More specifically, a mask 11 (SiO₂, SiN, etc.) is deposited on the silicon substrate 10, and a photoresist pattern is formed on the mask 11 by photolithography. Subsequently, the silicon substrate 10 is subjected to selective etching using the processed mask 11, and an insulation film is filled in a shallow trench formed by the etching to form the device isolation region 12. A region 10a which is not etched by the selective etching using the mask 11 but remains becomes the active area.

Figure 6B:
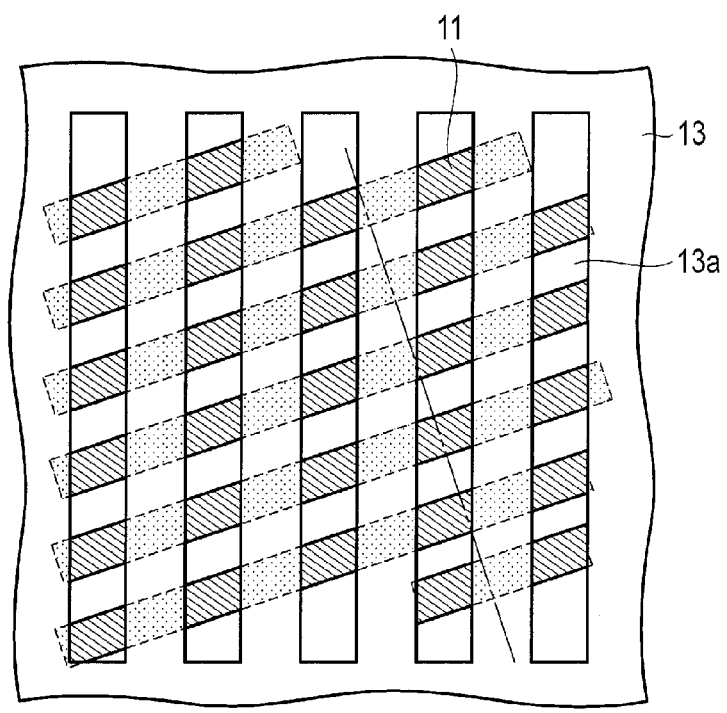
Figure 6C:
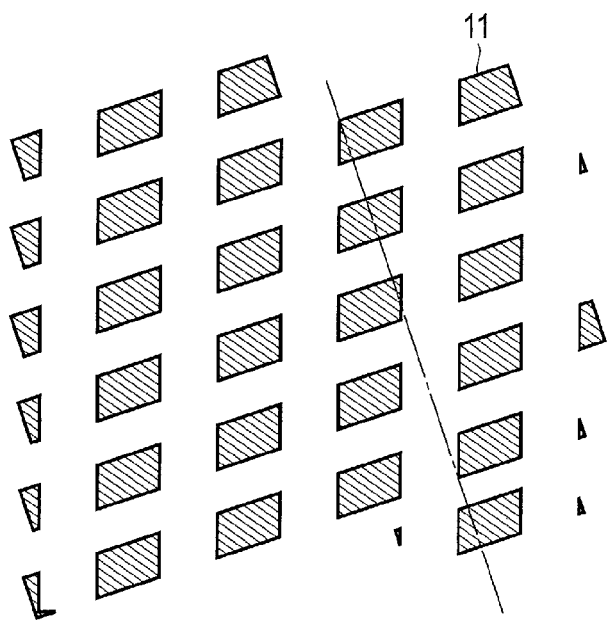

Next, to cut the active area at several times and obtain a desired shape, a mask 13 for a first active area cut is formed as shown in FIG. 6B and FIG. 7B. In other words, the mask 13 having an opening 13a is formed at the first active area portion. After that, the active area in a region which is not covered with the mask 13 and the device isolation region 12 are etched as shown in FIG. 6C and FIG. 7C. To avoid inconvenience in the formation of an embedded insulation film at forming the device isolation region later, depths of their etching should desirably correspond to a depth of the first device isolation region 12 as much as possible. The portion left by the etching becomes a region 22 where the contact is to be formed.

Figure 6D:
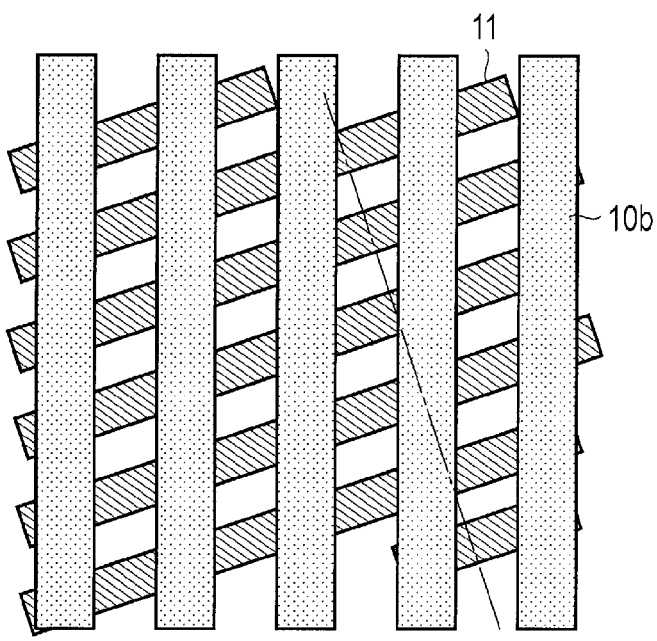

Next, a necessary portion is backfilled with silicon by executing epitaxial growth of silicon 10b in a region where silicon is exposed, other than the contact pad island region and the device isolation region, as shown in FIG. 6D and FIG. 7D. The silicon redundantly subjected to epitaxial growth is smoothed as needed. The region backfilled with the silicon is processed later to form the channel region.

The reason for this is that coexistence of the lithography and etching is highly difficult in process in relation to the oblique pattern, and the horizontal and vertical pattern. By separate processing both the patterns, lowering the degree of difficulty is attempted.

Furthermore, second to fifth active area cuts are sequentially executed, and a desired narrow active area (i.e. fin region) is formed. Of course, close attention needs to be paid to pattern displacement, but the narrow fin region can be processed independently of the contact pad region by such processing. The mask for processing the active area has so called a hole type pattern. A desired pattern cannot be wholly formed due to limitation to the lithography for the hole-type pattern. For this reason, patterning in the checker flag type and repeating the etching are currently considered as solution for this problem. In future, if the lithography technology is much more advanced, of course, these hole-type patterns may be wholly formed at once.

Figure 6E:
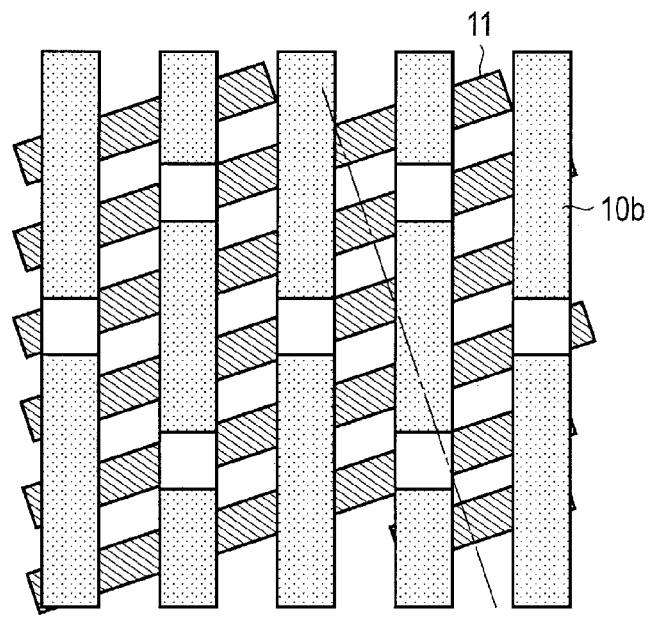

More specifically, a hole-shaped mask 14 for the second active area cut is formed and then the second active area is cut, as shown in FIG. 6E and FIG. 7E.

Figure 6F:
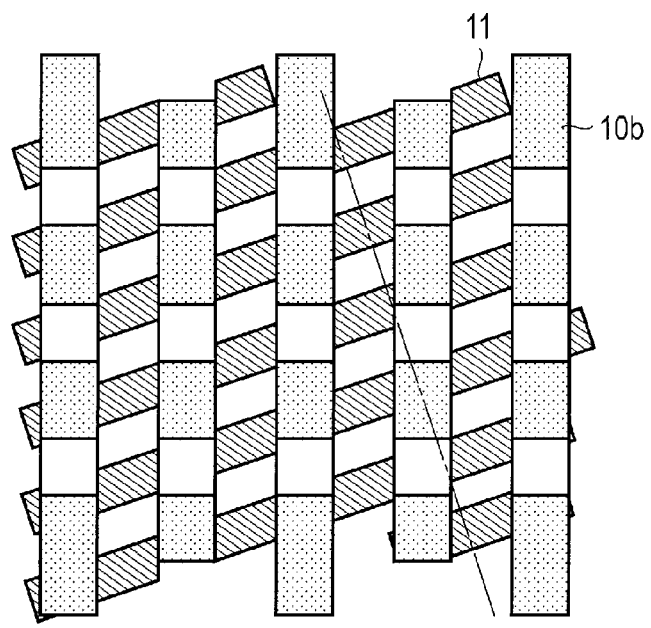

After that, a hole-shaped mask 15 for the third active area cut is formed and then the third active area is cut, as shown in FIG. 6F and FIG. 7F.

Figure 6G:
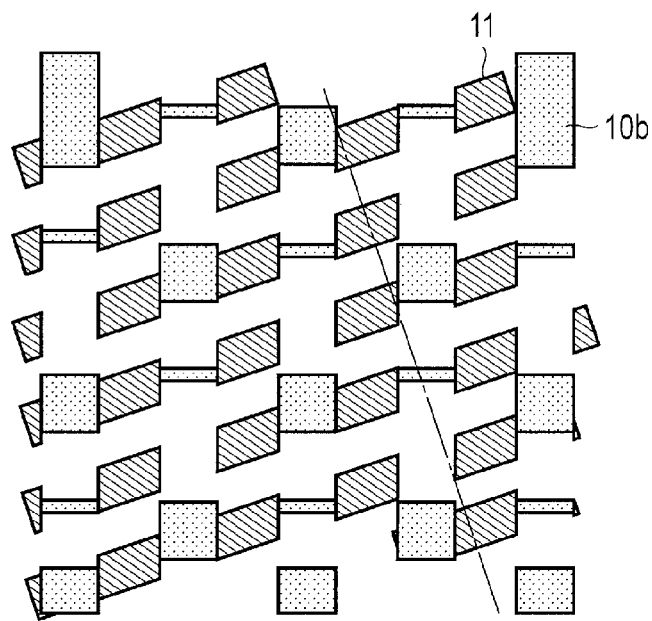

Next, a hole-shaped mask 16 for the fourth active area cut is formed and then the fourth active area is cut, as shown in FIG. 6G and FIG. 7G.

Figure 6H:
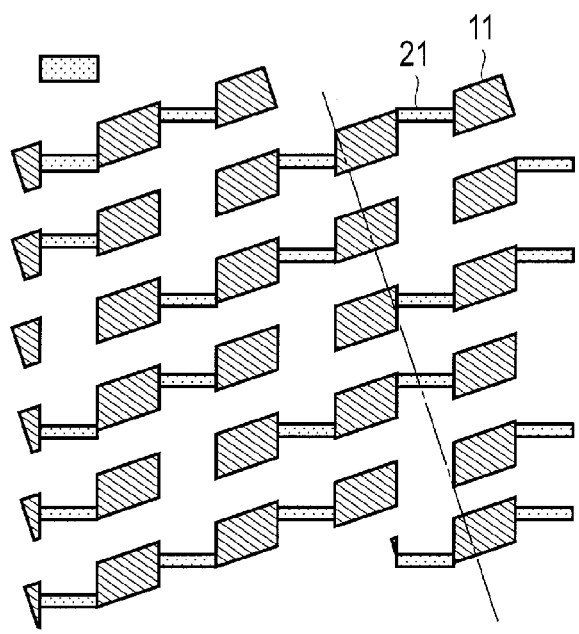

After that, a hole-shaped mask 17 for the fifth active area cut is formed and then the fifth active area is cut, as shown in FIG. 6H and FIG. 7H.

The fin-shaped active area 21 is thereby formed.

The basic processing of the active area is thus ended and then the WL (gate electrode) 31 is formed as shown in FIG. 6I and FIG. 7I.

Next, the mask member on the parallelogram contact pad region is removed and the contact region 22 is formed, as shown in FIG. 6J and FIG. 7J. Furthermore, the contact plug 25 and the source line 32 to be connected to the source-side contact region 22a are formed.

After this step, the MTJ element 40 to be connected to the drain of the transistor via the contact plug 26 is formed. Then, the structure shown in FIG. 4 is completed by forming the contact plug 27 and the bit line 33 to be connected to the other end of the MTJ element 40.

A cross-sectional view seen when a cell transistor is cut in a direction (horizontal direction) vertical with the WL long side direction is shown in FIG. 5A. The height of the silicon subjected to epitaxial growth of the region which is to be the channel is set to be equal to the height of the contact pad region from which the mask member is to be removed. For this reason, if the mask member is removed from the contact pad region to expose the silicon, the highest portion of the contact pad portion silicon becomes lower than the silicon channel portion. Accordingly, in the present embodiment, the fin-FET is shaped to be different in contact height (position) from a general Fin-FET.

In the conventional Fin-FET, the contact region (position of contact between the contact plug and the source/drain regions) is the same or higher than the channel region, since the channel region and the source/drain regions are equal in height or raised S/D structure by epitaxial growth is adopted. Oppositely, if the contact region is lower, suppression of the short channel effect becomes difficult, since a current path flows under the fin. In fact, however, the region lower than the gate electrode is somewhat devised to prevent an off-leakage current in the Fin-FET. For example, an impurity concentration is set to be higher in a region deeper than the gate region. For this reason, even if the contact region is somewhat lower than the channel region, practical problems rarely arise with respect to off-leakage.

Since an effective channel width becomes great by adopting the Fin-FET like the present structure as a cell transistor, the channel resistance itself is reduced. Furthermore, since the current path from the S/D can easily flow to the lower side of the fin, sufficient suppression of the short channel effect can contribute to the high current drive.

Thus, according to the present embodiment, the active area 20 for forming the selective transistor for switching is provided along the X direction, i.e. in a direction perpendicular to the gate electrode, at a portion (21) crossing the gate electrode. Furthermore, the active area 20 is formed to be inclined from the X direction, i.e., shaped in a parallelogram seen from a direction perpendicular to the substrate surface, between adjacent gate electrodes (22). For this reason, the channel region (21) and the WL region (gate region), of the transistor, can be made perpendicular to each other and the device properties can be improved. Moreover, since the contact region (22) is formed to be shaped in a parallelogram, the contact region area can be maximized while maintaining the distance in device isolation region between contact pads. For this reason, difficulties in various manufacturing processes such as lithography, etching, and embedment of the insulation film in the device isolation region can be removed.

In other words, the multi-gate FET represented by the Fin-FET can be formed in the $6F^2$-type cell layout. Then, the cell transistor capable of forming the current drive force even if downsized, and having little property variation resulting from the channel impurities can be used. The device layout capable of using the cell transistor having a minimized cell area in the memory device, and also having high performance and suppressed property variation can be thereby implemented.

(Second Embodiment)

Figure 8:
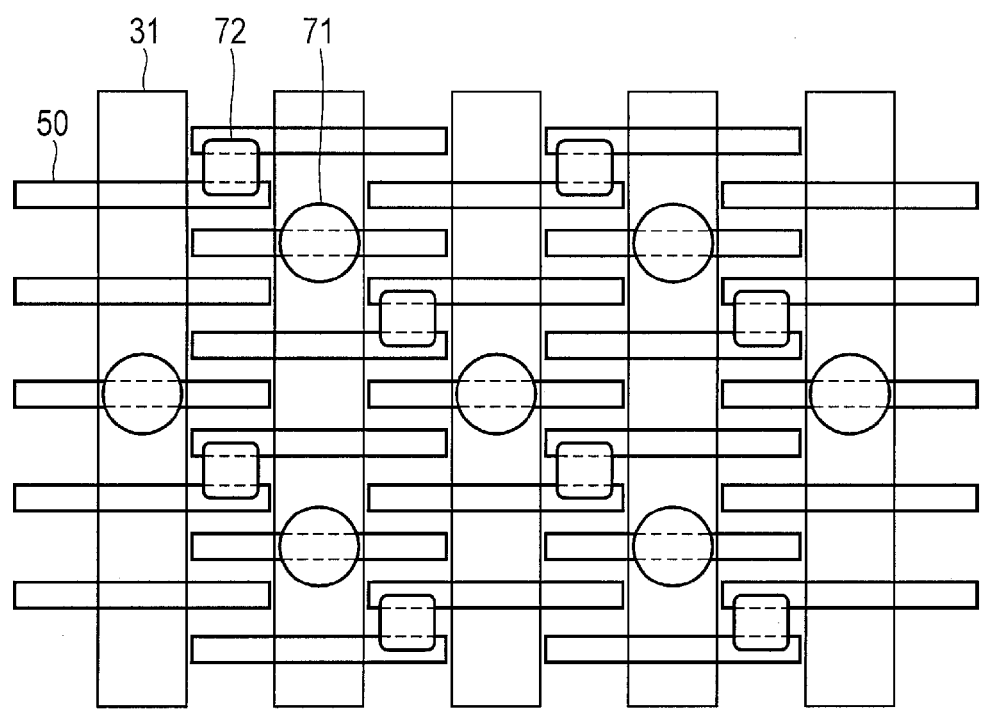
FIG. 8 shows an illustration for describing a concept of an MRAM according to a second embodiment.

FIG. 8 shows an illustration for describing a concept of an MRAM cell according to a second embodiment.

Forming the cell layout in FIG. 1 by the straight lines in the vertical and horizontal directions alone has been considered with reference to FIG. 3, however the manufacturing process is difficult as described above. Thus, forming an active area 50 by linear fins alone as shown in FIG. 8 will be considered. To obtain an equivalently similar pattern to the pattern shown in FIG. 3, however, the fins needs to be partially cut and a contact portion needs to be formed.

In FIG. 8, a circle denoted by 71 presents a region where the fin pattern needs to be cut. A source mark region is formed at a mark denoted by 72. It can be understood from this figure that a layout equivalent to the layout shown in FIG. 4 can be formed if, in FIG. 3, the contact pad region can be removed and two adjacent fins can be connected by using the contact region similarly to a local interconnect. Thus, the second embodiment aims at implementing the cell layout shown in FIG. 4 based on the pattern formed of an assembly of the fins.

Figure 9:
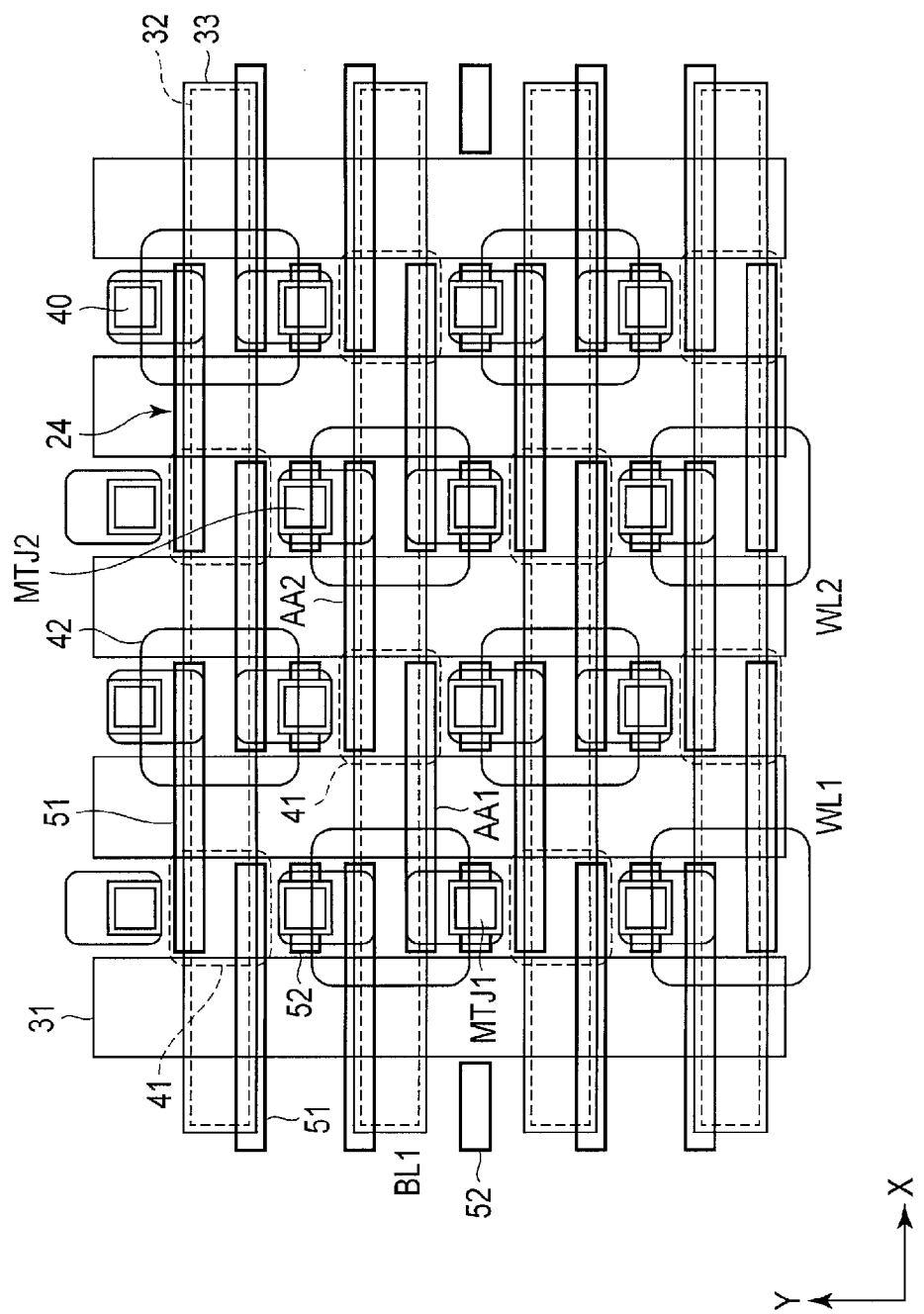
FIG. 9 is a view showing a planar layout of the MRAM according to the second embodiment.

FIG. 9 is a view showing a cell layout of an MRAM according to the second embodiment. Like or similar portions to the portions shown in FIG. 4 are denoted by the same reference numbers, and their detailed explanations are hereinafter omitted.

Fin-shaped active areas 51 for device formation are spaced apart from each other at regular intervals, on a silicon substrate (not shown). Each of the active areas 51 is provided along the X direction.

Resistance change elements, for example, MTJ elements 40 arrayed in a matrix in the X direction and the Y direction perpendicular to the X direction, are formed over the substrate.

Selective transistors 24 are provided to correspond to the respective MTJ elements 40, in the active areas 51. A plurality of gate electrodes 31 of the transistors 24 are arranged along the Y direction and spaced apart from each other at regular intervals in an X direction.

Each of the active areas 51 is provided to cross one of the gate electrodes 31, and the active areas 51 adjacent in the Y direction are displaced in the X direction.

A part of side surfaces of the active area 51 is connected to a part of side surfaces of the other active area 51 via a metal member, to share source-side contact regions of the transistors 24 adjacent in the X direction. In other words, sources of two transistors 24 adjacent in the X direction are commonly connected with each other at a source-side contact portion 41.

Fin-shaped active areas 52 for dummy fins are spaced apart from each other at regular intervals, on the substrate. The active areas 52 for dummy fins are shorter in the X direction than the active area 51 for device formation, and are provided along the X direction without crossing the gate electrodes 31. Furthermore, the active areas 52 for dummy fins are provided in close vicinity of drain portions of the active area 51 for device formation.

A drain-side contact region of the transistor 24 is formed between a part of the side surface of the active area 51 for device formation and the side surface of the active area 52 for dummy fins. In other words, a part of the side surface of the active area 51 for device formation forming the drain of the transistor 24 is connected with a part of the side surface of the active area 52 for dummy fins via the metal material.

A source-side contact region and a drain-side contact region of the active area 51 for device formation are formed on side surfaces opposite to each other about a center of a long side direction of the active area 51 for device formation.

The cell layout further comprises a source line 32 arranged along the X direction, and the source-side contact regions of the transistors 24 adjacent in the X direction are connected with the same source line 32.

The cell layout further comprises a bit line 33 arranged along the X direction, and the MTJ element 40 is connected between the drain-side contact region and the bit line 33. In other words, the end of the MTJ element is connected to the drain of the transistor 24 and the other end of the MTJ element is connected to the bit line 33. The MTJ elements 40 adjacent in the X direction are connected to different bit lines 33.

Next, a manufacturing method of the present embodiment will be described with reference to plan views in FIG. 10A to FIG. 10H and cross-sectional views in FIG. 11A to FIG. 11C.

Figure 10A:
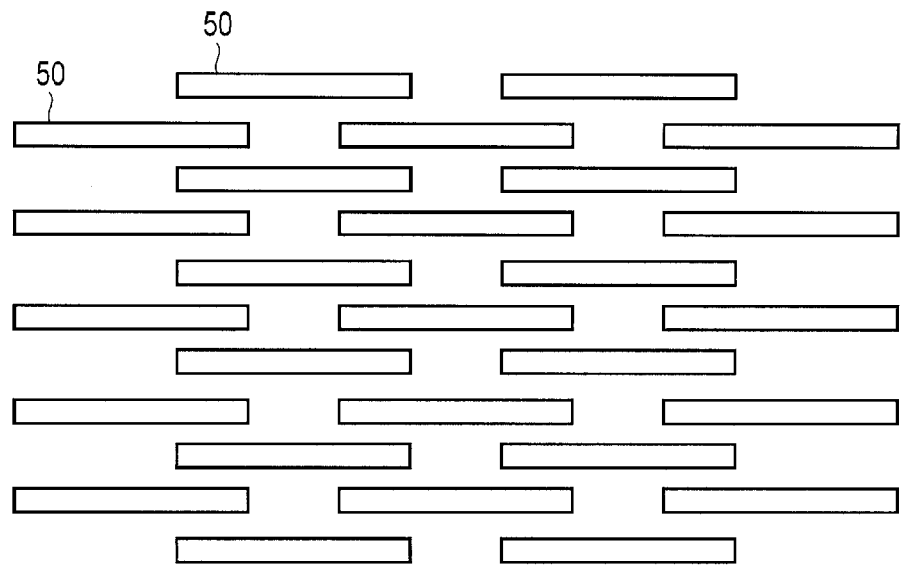

FIG. 10A shows a planar layout formed after processing the fin pattern. This can be formed by repeating the double patterning while noticing a matching accuracy of lithography.

More specifically, fin-shaped active layers 50 having a length equivalent to 3F in the X direction are arranged at 4F pitch in the X direction and 1F pitch in the Y direction. Furthermore, the active layers adjacent in the Y direction are displaced by 2F pitch in the X direction.

Figure 10B:
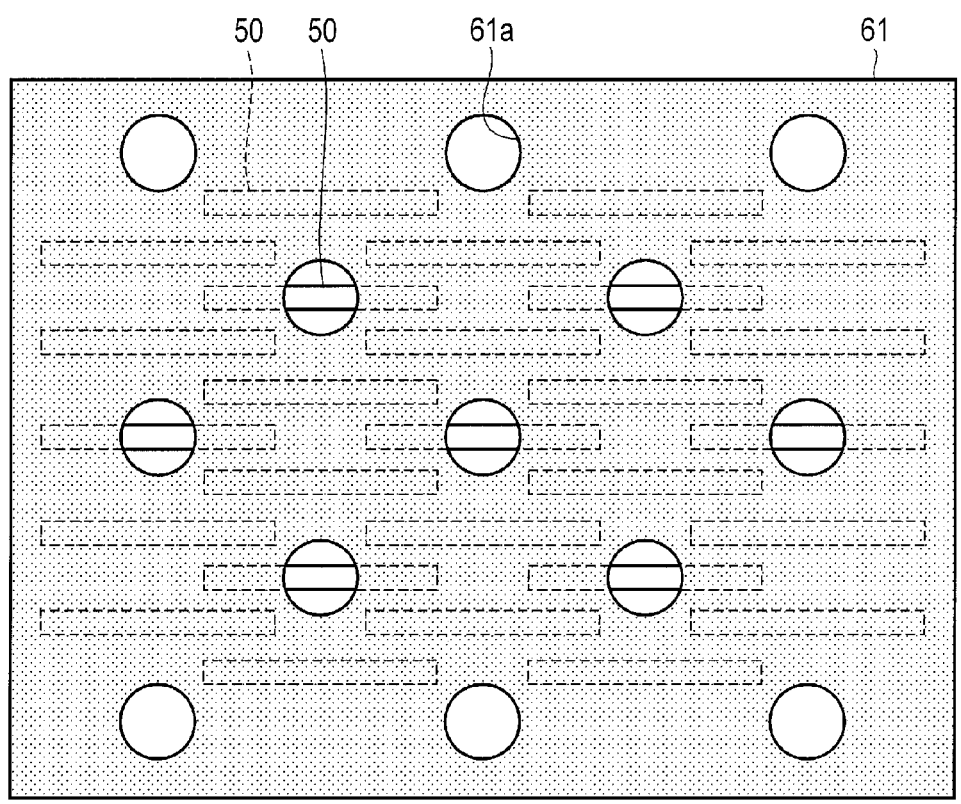
Figure 10C:
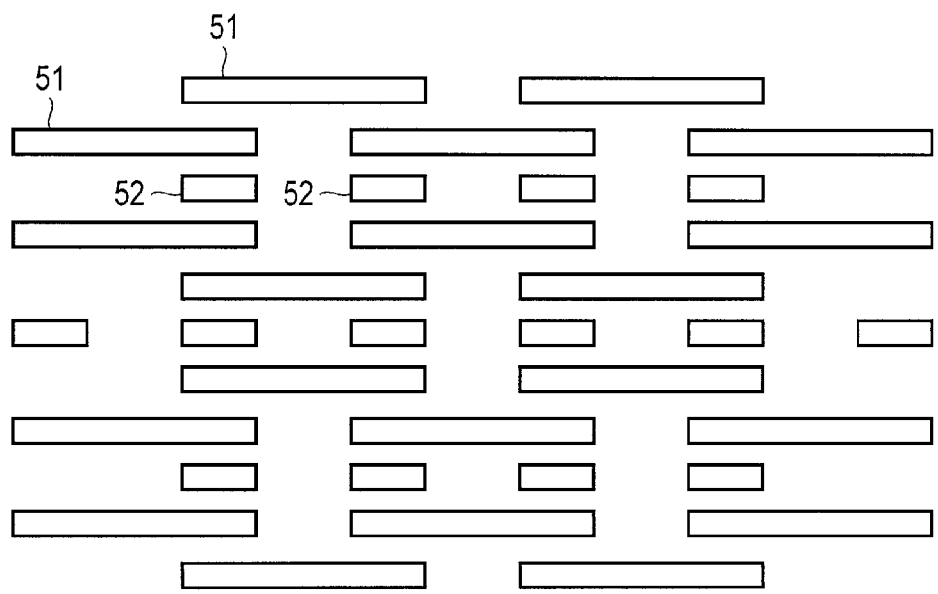

Next, a fin cut mask 61 having circular opening patterns 61a are prepared to remove an unnecessary fin region, as shown in FIG. 10B. Then, the pattern shown in FIG. 10C is obtained by etching using the mask 61. Portions of the fins which are not cut are the active areas 51 for device formation and cut portions are the active areas 52 for dummy.

Figure 10D:
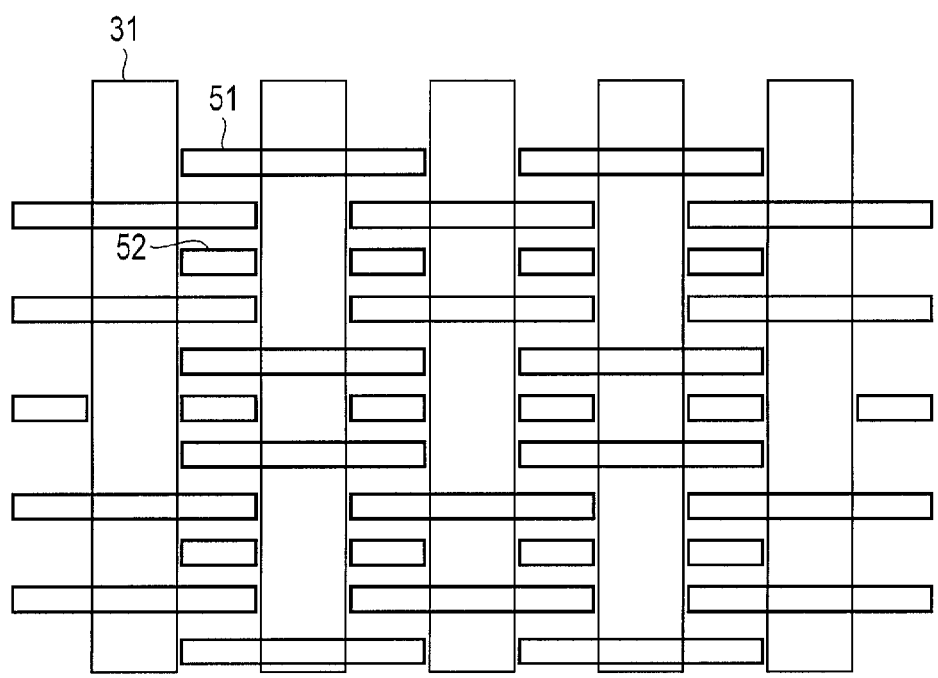

Next, the gate electrodes 31 are formed by depositing gate electrode materials and processing the materials by lithography and etching, as shown in FIG. 10D. The gate electrodes 31 are arranged along the Y direction and spaced apart from each other at regular intervals in the X direction, similarly to the first embodiment.

Next, contact regions are formed in several steps. This is because metal wiring layers used on the source side and the drain side are different.

First, source-side contact portions 41 are formed as shown in FIG. 10E. At this time, two fins are necessarily connected in the contact region such that a contact falls between the fins, but does not fall to a bottom portion of a gap between the fins. FIG. 11A shows a cross section of a one-dot-chained line IV-IV' in FIG. 10E. In FIG. 11A, two fins (active areas for device formation) 51 are connected with each other by a metal 45 embedded in the contact portion 41.

Subsequently, metal wiring of a source line 32 connecting the formed contact portions 41 is formed. The source lines 32 are arranged along the X direction and spaced apart from each other at regular intervals in the Y direction, similarly to the first embodiment.

Figure 10G:
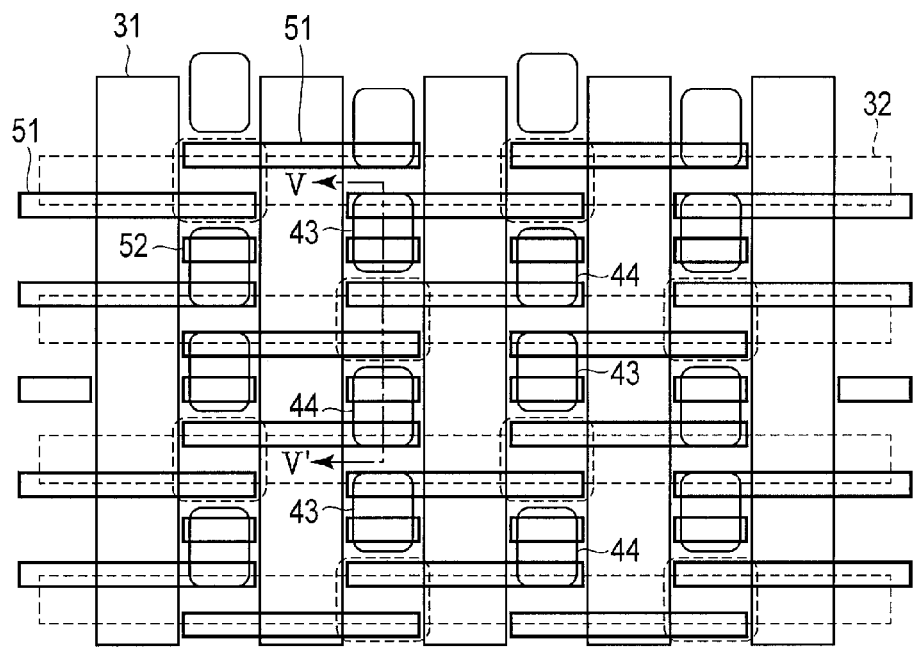

Next, drain-side contact portions 43 and 44 are formed to extend between the formed source lines 32, as shown in FIG. 10F and FIG. 10G. FIG. 11B shows a cross section of a one-dot-chained line V-V' in FIG. 10G. The active areas 51 for device formation and the active areas 52 for dummy are connected by the contact portions 43 and 44 as shown in FIG. 11B.

When the drain-side contact portions 43 and 44 are formed, the formation needs to be executed in two steps using the double patterning since a pattern density of contact is too large to apply single patterning exposure. Furthermore, the drain contact portion 44 formed at the second time needs to be displaced slightly vertically from the drain contact portion 43 formed at the first time, in relation to the fins connected by using the contact portions. This matter needs to be considered most carefully when the layout shown in FIG. 1 is formed by the fin pattern alone.

Figure 10H:
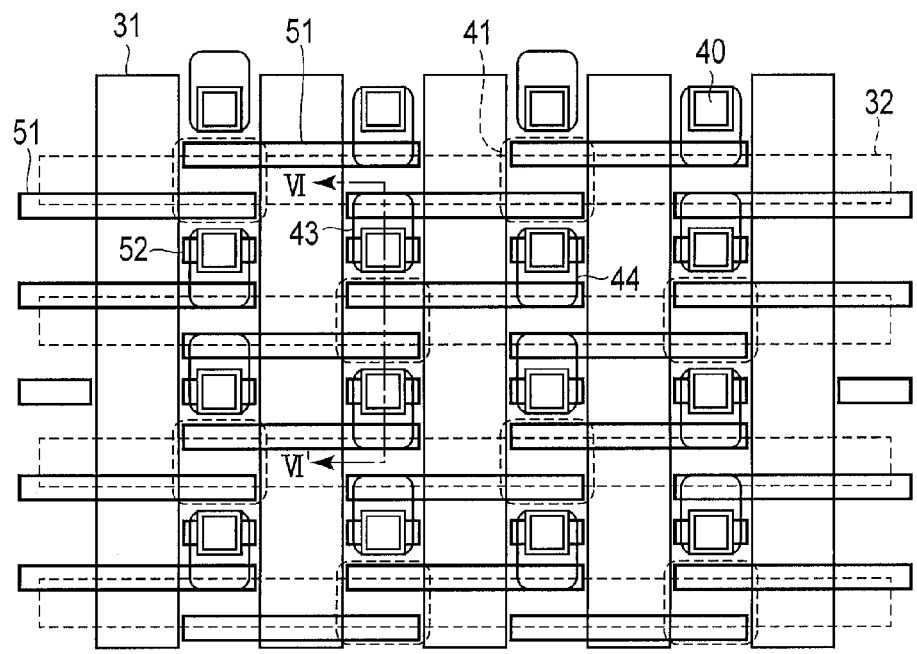

Next, the MTJ elements 40 are formed to be connected to the drain-side contact portions 43 and 44 as shown in FIG. 10H. At this time, if the MTJ elements 40 are arranged in a grating shape and spaced apart with regular intervals, the arrangement is advantageous in lithography and processing. A cross section of a one-dot-chained line VI-VI' in FIG. 10H is shown in FIG. 11C. The MTJ elements 40 are arranged on the respective contact portions 43 and 44 as shown in FIG. 11C.

Subsequently, the structure shown in FIG. 9 can be obtained by forming the bit lines 33 to be connected to the MTJ elements 40 in the X direction. The bit lines 33 are formed above the source lines 32 and can be connected to the other ends of the MTJ elements 40.

Two active areas AA1 and AA2 of the plural of the active areas 51 for device formation, two word lines WL1 and WL2 of the plural of word lines 31, and a bit line BL1 of the plural of bit lines 33 shown in FIG. 9 are noticed here.

The active area AA1 is provided to be perpendicular with the word line WL1, and a first selective transistor is formed in the active area AA1. The active area AA2 is provided to be perpendicular with the word line WL2, and a second selective transistor is formed in the active area AA2. The active areas AA1 and AA2 are displaced from each other in the Y direction.

The contact portion 41 to connect sources of first and second selective transistors is formed by connection of side surface portions of the respective active areas AA1 and AA2, between the word lines WL1 and WL2. A first resistance change element MTJ1 is connected between the bit line BL1 and a drain of the first selective transistor. A second resistance change element MTJ2 is connected between the bit line BL1 and a drain of the second selective transistor.

In other words, a first cell is formed of the active area AA1, the word line WL1, the first resistance change element MTJ1, and the bit line BL1, and a second cell is formed of the active area AA2, the word line WL2, the second resistance change element MTJ2, and the bit line BL1. Then, a number of cells can be arranged by spacing the first and second cells that are considered as basic structures at regular intervals.

Thus, in the present embodiment, the contact regions can be formed without contact pad regions when a multi-gate FET represented by a Fin-FET is used in the resistance change type memory cell. In other words, the Fin-FET can be used as the cell transistor without the contact pad regions. In addition, the current path can be connected to the source line and the bit line, by defining formation of the sources and the drain contact regions of the Fin-FET at symmetrical positions about the fins and by obliquely extending the current path. In other words, the current path can be formed in the same direction as the oblique active area shown in FIG. 1. Advantages similar to the advantages of the first embodiment can be therefore obtained.

In addition, the source-side contact is formed at the center of the fins where the channel is formed, and can be supplied with a current uniform for both the fins. In other words, the contact pad-less Fin-FET can be used as a cell transistor. Furthermore, the embodiment also has an advantage that the drain-side contacts arranged more closely to each other can be subjected to lithography and processing and that the drain-side contacts can be connected to the bit lines.

(Modified Embodiment)

The invention is not limited to the above-described embodiments.

The invention is characterized by the cell layout, and the material of each portion is not limited at all. The resistance change element is not limited to the MTJ element, but may be any element that has a resistance value changing in accordance with the storing status.

In addition, the method of forming the active area is not limited to the embodiments, and can be modified arbitrarily. For example, if lithography can be much improved and executed, the pattern of the first embodiment shown in FIG. 10 can be formed by executing etching at one time. Furthermore, by further improving the accuracy of lithography, the steps of the second embodiment shown in FIG. 6A to FIG. 6G can be omitted and the pattern shown in FIG. 6H can be formed directly.

In addition, in the second embodiment, if sufficient contact with the MTJ elements can be formed without the active areas for dummy, the active layer for dummy can be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device, comprising:
   active areas arranged and spaced apart at first intervals, on a semiconductor substrate, each of the active areas being provided along an X direction;
   resistance change elements arrayed in a matrix, in an X direction and a Y direction perpendicular to the X direction, above the substrate; and
   selective transistors provided to correspond to the resistance change elements, in the active areas,
   wherein:
   gate electrodes of the selective transistors are spaced apart at second intervals in the X direction and arranged along the Y direction,
   each of the active areas is provided to cross one of the gate electrodes, and each of the active areas includes a source region, a drain region, and a channel region of one of the selective transistors,
   in two of the active areas adjacent to each other and crossing different gate electrodes, a part of side surfaces of one of the active areas is connected to a part of side surfaces of the other of the active areas to share the source region of one of the selective transistors.

2. The device of claim 1, wherein each of the selective transistors is a Fin-FET.

3. The device of claim 1, further comprising active areas for a dummy pattern arranged and spaced apart at third intervals, on the substrate,
   wherein the active areas for the dummy pattern are shorter than the active areas, in the X direction, provided along the X direction without crossing the gate electrodes, and provided in close vicinity of drain portions of the selective transistors in the active areas.

4. The device of claim 3, wherein a part of a side surface of the active areas is connected to a side surface of each of the active areas for dummy pattern via a metal material so as to form the drain region at each of the selective transistors.

5. The device of claim 4, wherein in each of the active areas, the source region and the drain region are formed on side surfaces mutually opposite to each other relative to an axis of symmetry perpendicular to a longer side direction of the active area.

6. The device of claim 4, wherein an angle θ formed between a direction linking a central portion of the source region and a central portion of the drain region, and the X direction, is an angle presented as $\theta=\tan^{-1}(1/3)$.

7. The device of claim 4, further comprising:
a source line arranged along the X direction; and
a bit line arranged along the X direction,
wherein the source region of one of the select transistors is connected to the source line, and each of the resistance change elements is connected between the drain region and the bit line.

8. The device of claim 7, wherein the resistance change elements adjacent in the X direction are connected to different bit lines.

9. The device of claim 1, wherein:
longer side directions of the active areas are set to be perpendicular to the Y direction, and connection of the two active areas are made via a metal material.

10. A magnetoresistive memory device, comprising:
first and second word lines arranged parallel to each other;
a first active area, for formation of a first selective transistor, a longer side of the first active area being perpendicular to the first word line, the first active area including a source region, a drain region, and a channel region of the first selective transistor;
a second active area, for formation of a second selective transistor, a longer side of the second active area being perpendicular to the second word line, the second active area including a source region, a drain region, and a channel region of the second selective transistor;
a contact module which contacts the source regions of the first and second selective transistors by connection of side surface portions of the respective first and second active areas, between the first and second word lines;
a first resistance change element connected between a bit line perpendicular to the first and second word lines, and a drain of the first selective transistor; and
a second resistance change element connected between the bit line and a drain of the second selective transistor.

11. The device of claim 10, wherein each of the first and second selective transistors is a Fin-FET.

* * * * *